US009368855B2

(12) United States Patent
Yuasa et al.

(10) Patent No.: US 9,368,855 B2
(45) Date of Patent: Jun. 14, 2016

(54) PLANAR CIRCUIT TO WAVEGUIDE TRANSITION HAVING OPENINGS FORMED IN A CONDUCTIVE PATTERN TO FORM A BALANCE LINE OR AN UNBALANCE LINE

(71) Applicants: Takeshi Yuasa, Tokyo (JP); Tetsuya Oba, Tokyo (JP); Akimichi Hirota, Tokyo (JP); Tetsu Owada, Tokyo (JP)

(72) Inventors: Takeshi Yuasa, Tokyo (JP); Tetsuya Oba, Tokyo (JP); Akimichi Hirota, Tokyo (JP); Tetsu Owada, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/377,408

(22) PCT Filed: Jan. 17, 2013

(86) PCT No.: PCT/JP2013/050801
§ 371 (c)(1),
(2) Date: Aug. 7, 2014

(87) PCT Pub. No.: WO2013/140840
PCT Pub. Date: Sep. 26, 2013

(65) Prior Publication Data
US 2015/0008991 A1 Jan. 8, 2015

(30) Foreign Application Priority Data
Mar. 19, 2012 (JP) .................. 2012-062194

(51) Int. Cl.
*H01P 5/107* (2006.01)
*H01P 3/12* (2006.01)
*H05K 1/02* (2006.01)

(52) U.S. Cl.
CPC ............... *H01P 5/107* (2013.01); *H01P 3/121* (2013.01); *H05K 1/0245* (2013.01); *H05K 1/0253* (2013.01); *H05K 1/0296* (2013.01)

(58) Field of Classification Search
CPC ........................................ H01P 5/107
USPC ................................................. 333/26
See application file for complete search history.

(56) References Cited

U.S. PATENT DOCUMENTS 6,060,959 A * 5/2000 Yakuwa ................. 333/26
6,087,907 A 7/2000 Jain
(Continued)

FOREIGN PATENT DOCUMENTS

DE 11 2009 000 784 T5 11/2011
EP 1923950 A1 5/2008
(Continued)

OTHER PUBLICATIONS

International Search Report; PCT/JP2013/050801; Mar. 19, 2013.
(Continued)

*Primary Examiner* — Benny Lee
(74) *Attorney, Agent, or Firm* — Studebaker & Brackett PC

(57) ABSTRACT

Openings are formed by removing part of a ground conductor, and a differential signal line including signal line conductors is configured with some of the openings. In addition, a metal block is mounted thereon to cover the opening to thus configure a waveguide using the metal block and ground conductor as wall surfaces. A planar circuit to waveguide transition according to the above can achieve traveling wave conversions from a waveguide mode to a slot mode, and from the slot mode to a differential mode without utilizing resonance, which makes it possible to align a dominant direction of an electric field by the three ones; thus, a wider bandwidth can be expected. Thus, the wider bandwidth can be achieved with a simple layer structure.

14 Claims, 8 Drawing Sheets

(56) References Cited

U.S. PATENT DOCUMENTS

| | | |
|---|---|---|
| 7,463,110 B2 * | 12/2008 | Lapierre et al. ............... 333/26 |
| 7,479,842 B2 * | 1/2009 | Gaucher et al. ............... 333/26 |
| 2004/0155723 A1 | 8/2004 | Koriyama |
| 2008/0042773 A1 | 2/2008 | Koriyama |
| 2011/0025552 A1 | 2/2011 | Sagala et al. |

FOREIGN PATENT DOCUMENTS

| | | |
|---|---|---|
| JP | 2000-101311 A | 4/2000 |
| JP | 2004-153415 A | 5/2004 |
| JP | 2010-056920 A | 3/2010 |
| JP | 2010-206390 A | 9/2010 |

OTHER PUBLICATIONS

Z. Tong, A. Stelzer; "A Millimeter-wave Transition from Microstrip to Waveguide Using a Differential Microstrip Antenna"; Proceedings of the 40th European Microwave Conference; Sep. 2010; pp. 660-663.

The First Office Action issued by the Chinese Patent Office on Jul. 23, 2015, which corresponds to Chinese Patent Application No. 201380015126.X and is related to U.S. Appl. No. 14/377,408; with English language partial translation.

Z. Tong, et al.; "A Wide Band Transition from Waveguide to Differential Microstrip Lines"; Microwave Conference; 2008.

An Office Action issued by the German Patent Office on Oct. 21, 2015, which corresponds to German Patent Application No. 1102013 001 556.0-55 and is related to U.S. Appl. No. 14/377,408; with English language partial translation.

* cited by examiner (d) C-C'

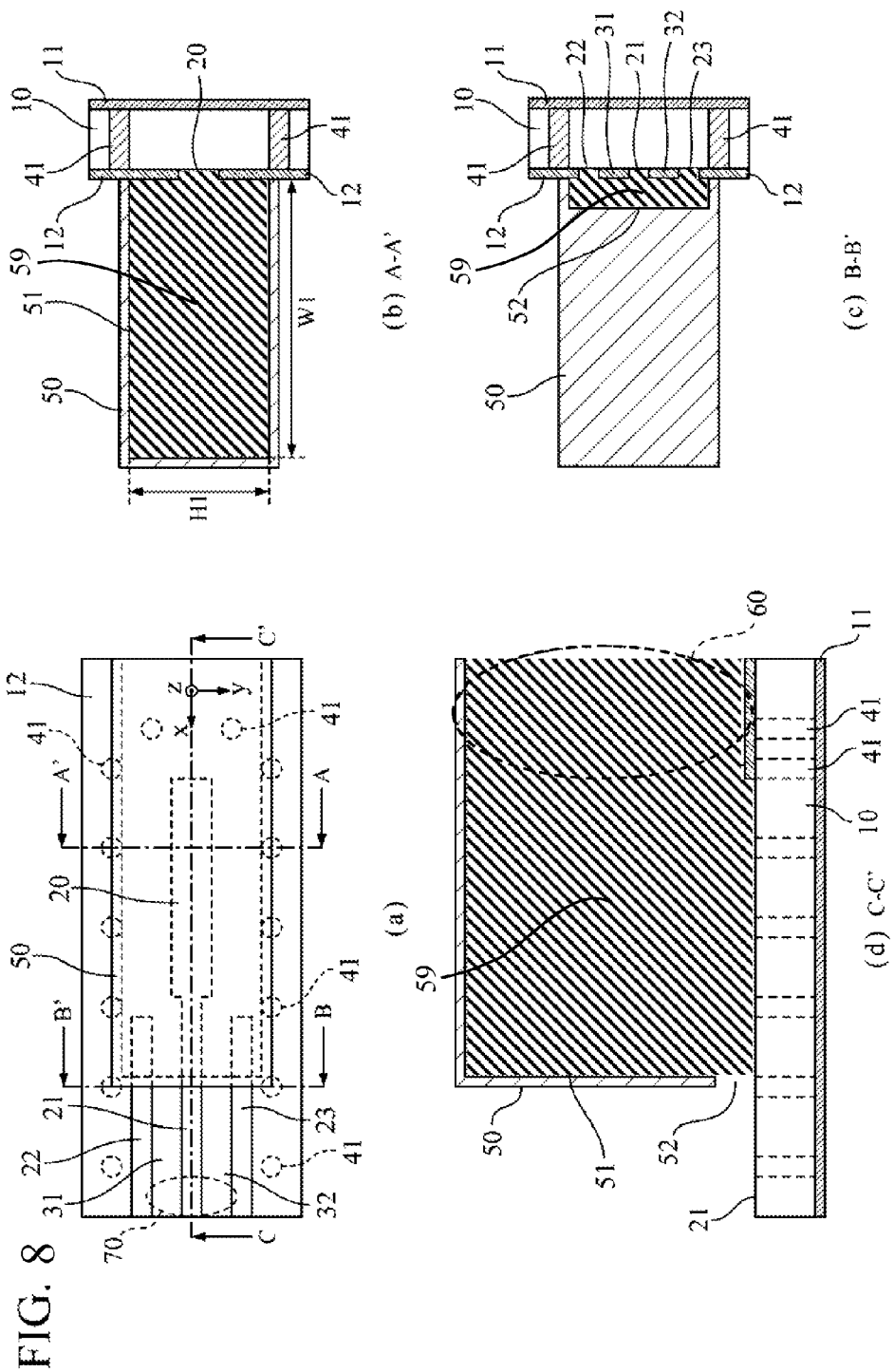

PLANAR CIRCUIT TO WAVEGUIDE TRANSITION HAVING OPENINGS FORMED IN A CONDUCTIVE PATTERN TO FORM A BALANCE LINE OR AN UNBALANCE LINE

TECHNICAL FIELD

The present invention relates to a planar circuit to waveguide transition.

BACKGROUND ART

For a structure of a conventional planar circuit to waveguide transition, the following structure is proposed: a differential line constituted of a pair of signal line conductors provided on a dielectric substrate of a single layer is connected to a rectangular patch conductor to transit a signal to a waveguide disposed above the substrate by utilizing resonance of the patch conductor (for example, Non-Patent Document 1).

On the other hand, there is disclosed a transition including a coaxial mode to waveguide mode transition in an inner layer of a multilayer substrate to transit a differential mode to a waveguide mode (for example, Patent Document 1).

PRIOR ART DOCUMENTS

Patent Documents

Patent Document 1: Japanese Patent Application Laid-open No. 2010-206390
Non-Patent Document 1: Ziqiang Tong and, Andreas Stelzer, "A Millimeter-wave Transition from Microstrip to Waveguide Using A Differential Microstrip Antenna" European Microwave Conference 2010 pp. 660-663.

SUMMARY OF THE INVENTION

Problems to be Solved by the Invention

However, while it can be configured simply with the dielectric substrate of the single layer in Non-Patent Document 1 that is a conventional technique, it is difficult to secure a wide specific (fractional) bandwidth that can be transited because of the use of the resonance of the patch conductor.

Additionally, in Non-Patent Document 1, a structure using two patch conductors for measurement of a wider bandwidth is proposed to thereby achieve a wider bandwidth as compared to the structure using a single patch conductor, but there is a limitation to the wider bandwidth such that a specific bandwidth of −15 dB or less in reflection characteristics is on the order of 8%.

On the other hand, in the structure shown in Patent Document 1, the specific bandwidth of the transition is determined by the specific bandwidth of the coaxial mode to waveguide mode transition provided in the inner layer of the multilayer substrate, and thus the specific bandwidth can generally be secured more widely as compared to that of the aforementioned structure that uses the patch conductors. However, the structure is complicated because of the use of a plurality of layers in a dielectric substrate and is thus easily affected by variations in manufacturing.

As mentioned above, there is a problem such that a wider bandwidth cannot be achieved with a simple layer structure like a surface layer part in the conventional planar circuit to waveguide transition.

An object of the present invention is to provide a planar circuit to waveguide transition that can achieve a wider bandwidth with a simple layer structure like a surface layer part.

Means for Solving the Problems

A planar circuit to waveguide transition of the present invention includes: a conductor pattern provided on one side of a dielectric substrate; a first opening in which part of the conductor pattern is removed; a second opening in which the conductor pattern is removed such that one end of the first opening is open to the second opening; a third opening and a fourth opening which are separated from the second opening, and in which the third and fourth opens are in parallel to an extending direction of the second opening at opposite positions across (on both sides of) the second opening; a first signal line conductor formed by the conductor pattern remaining in a region between the second opening and the third opening; a second signal line conductor formed by the conductor pattern remaining in a region between the second opening and the fourth opening to constitute a balanced line together with the first signal line conductor; and a metal member having a cavity and arranged to cover the first opening to constitute a waveguide together with the conductor pattern.

Effect of the Invention

According to the present invention, a wider bandwidth can be achieved as compared to the transition using the resonance in the conventional technique. In addition, there is an advantageous effect that makes possible both of an achievement of a simple layer structure like a single-layer substrate or a surface layer part of a multi-layer substrate, and wide bandwidth characteristics.

BRIEF DESCRIPTION OF THE DRAWINGS

FIGS. 8(*a*), 8(*b*), 8(*c*) and 8(*d*) are configuration diagrams illustrating a structure of a planar circuit to waveguide transition according to Embodiment 1 of the present invention where a cavity is filled with an insulating material.

BEST MODE FOR CARRYING OUT THE INVENTION

In the following, in order to describe the present invention in more detail, embodiments for carrying out the invention will be described with reference to the accompanying drawings where like features in the different drawing figures are denoted by the same reference labels. Embodiment 1.

Figure 1:
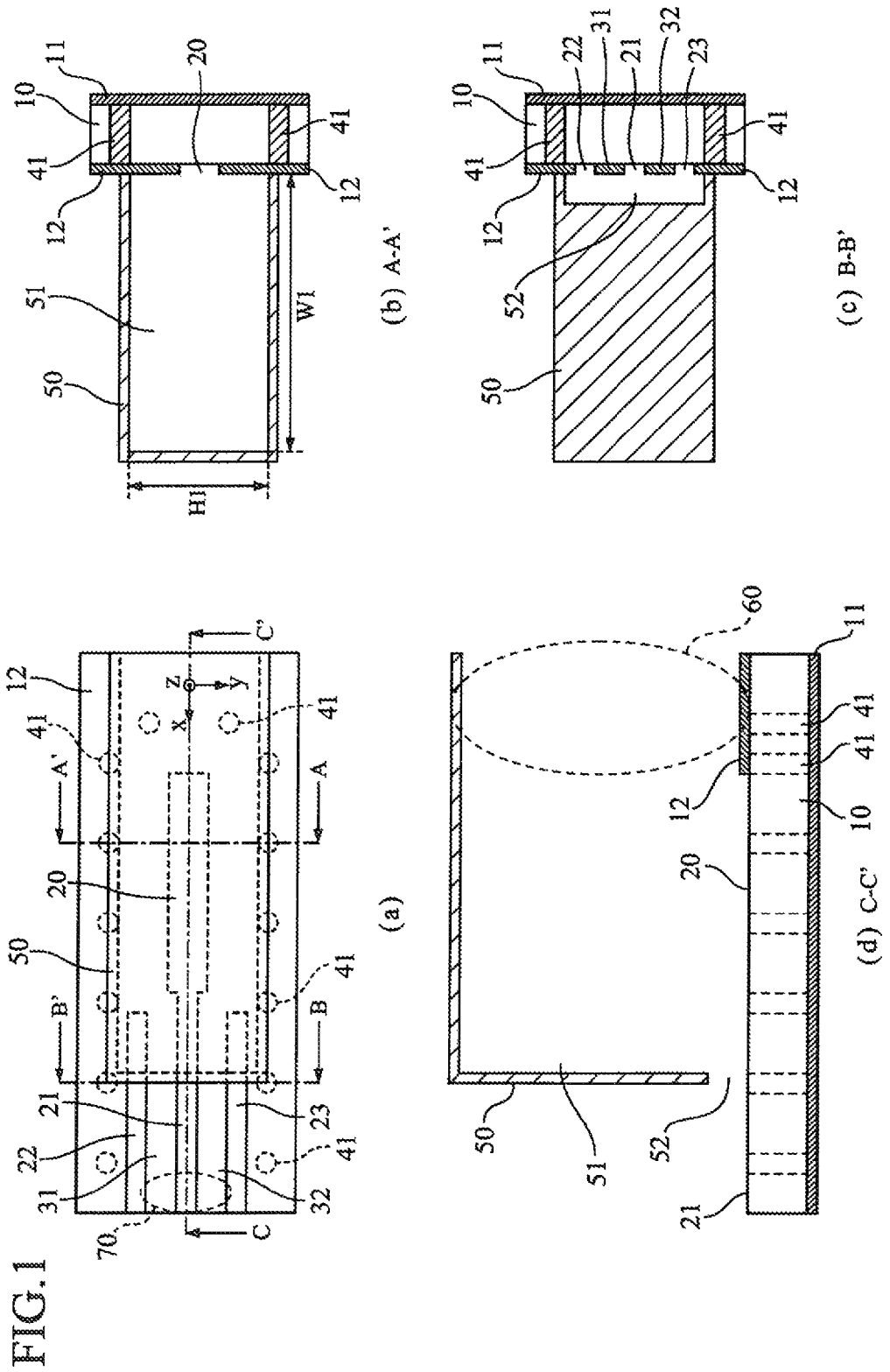
FIGS. 1(*a*), 1(*b*), 1(*c*) and 1(*d*) are configuration diagrams illustrating a structure of a planar circuit to waveguide transition according to Embodiment 1 of the present invention.

FIG. 1 is a diagram illustrating a structure of a planar circuit to waveguide transition according to Embodiment 1 of the present invention. FIG. 1(a) is a perspective top plan view, FIG. 1(b) is a cross-sectional view of an A-A' plane in FIG. 1(a), FIG. 1(c) is a cross-sectional view of a B-B' plane in FIG. 1(a), and FIG. 1(d) is a cross-sectional view of a C-C' plane in FIG. 1(a).

As shown in FIG. 1, the planar circuit to waveguide transition according to Embodiment 1 employs a structure in which a ground conductor 11 and a ground conductor (conductor pattern) 12 are formed on the lower and upper sides of a dielectric substrate 10, respectively.

In this case, the ground conductor 12 has an opening 20 in which part of a conductor is removed in a rectangular shape, and one short side of the opening 20 is connected to an opening 21 in which the conductor is removed to extend in one direction of FIG. 1(a). Additionally, in FIG. 1 there is illustrated a case where a width of the opening 20 (in a y-axis direction in the drawing) is larger than that of the opening 21; however, it is not limited to this, the width of the opening 20 may be equal to or smaller than that of the opening 21.

An opening 22 formed by removing the conductor to extend to a direction that is substantially the same as the extending direction of the opening 21 is provided on one side of the opening 21, and an opening 23 formed by removing the conductor to extend in a direction that is substantially the same as the extending direction of the opening 21 is provided on the other side of the opening 21.

Signal line conductors 31 and 32 are formed by these openings 21, 22, and 23, and a differential signal line (balanced line) 70 is constituted of these signal line conductors 31 and 32.

The ground conductors 12 and 11 are conducted to each other via a columnar conductor (connection conductor) 41 that penetrates the dielectric substrate 10 around the opening 20, and as shown in FIG. 1(a), are conducted to each other around the openings 22 and 23 via columnar conductors 41 with avoiding the regions of the signal line conductors 31 and 32.

A metal block (metal member) 50 is mounted on top of the dielectric substrate 10 so as to cover the opening 20. The metal block 50 has a cavity 51 inside, and a waveguide 60 using the metal block 50 and ground conductor 12 as wall surfaces is configured.

The waveguide 60 is extended in an x-axis negative direction shown in FIG. 1(a) and is connected to another waveguide circuit.

As shown in FIG. 1(c), an end portion in an x-axis positive direction of a cavity 51 is closed by the metal block 50 excepting a hole 52 prepared at the upper part of the signal line conductors 31 and 32.

With respect to a conduction between the metal block 50 and the ground conductor 12, a structure for conduction through another conductive material may be employed, or an electrical short circuit may be implemented at a particular frequency when a gap between the metal block 50 and ground conductor 12 is allowed.

In this connection, a y-z cross-sectional shape of the cavity 51 and waveguide 60, as shown in FIG. 1(b), is provided in a rectangular shape of W1>H1, where the y-z cross-section is through a plane defined by the y-axis and the z-axis and where a dimension in a z-axis direction is W1, and a dimension in a y-axis direction is H1.

Therefore, the lowest order mode (basic mode) of the waveguide 60 is the TE10 mode in which the electric field is oriented in the y-axis direction and has an intensity distribution of the field in the z-axis direction.

When a differential line constituted of the signal line conductors 31 and 32 is transmitted in a differential mode, signals of the signal line conductors 31 and 32 are put in an opposite-phase relation, and perfect electric conductor boundary conditions are applied in the C-C' plane in FIG. 1(a).

Therefore, most of an electric field distribution in a differential mode is generated between the signal line conductors 31 and 32, and the direction of the electric field becomes dominant in the y-axis direction.

The opening 20 located at a position that intermediates the TE10 mode and the differential mode can configure a slot line capable of transmitting a slot mode in which the electric field in the y-axis direction is dominant.

Therefore, the direction of the electric field of the opening 20 can be designed to the y-axis direction that is the same as the direction of the electric field in the TE10 mode, and the dominant direction of the electric field in the differential mode.

In the conventional technique, the differential line is connected to the rectangular patch conductors, and the conversion with the waveguide mode is achieved by utilizing a resonance mode of the patch conductors, so that a resonance bandwidth of the patch conductors is restricted; thus, there is a problem such that the specific bandwidth is limited.

In the structure shown in FIG. 1, traveling wave conversions from the waveguide mode to the slot mode, and from the slot mode to the differential mode can be achieved without utilizing resonance, and it becomes possible to align the dominant direction of the electric field by the three modes as stated above; thus, a wider bandwidth can be expected as compared to the conventional technique that utilizes the resonance phenomenon.

The differential signal line-waveguide transition shown in FIG. 1 is designed with an aim to confirm the aforementioned effects. Calculation values of design results are shown in FIG. 2.

Figure 2:
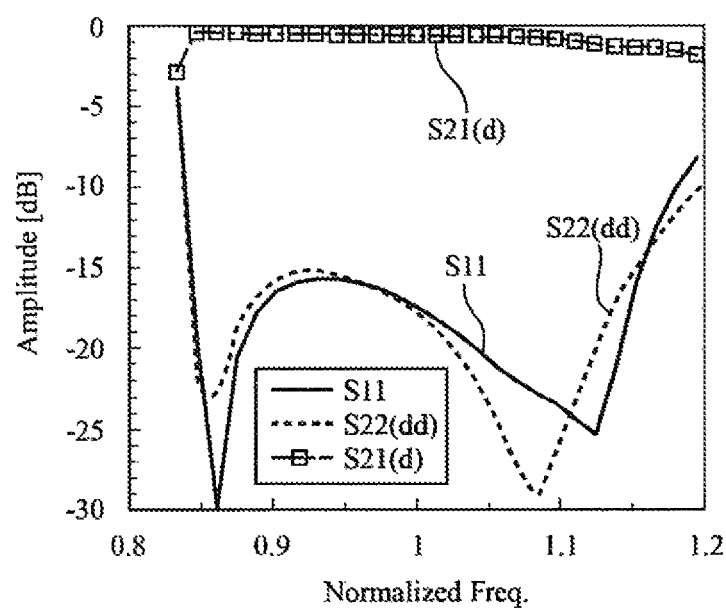
FIG. 2 is a diagram showing conversion characteristics by a simulation of a differential signal line-waveguide transition.

In FIG. 2, S11 shows reflection characteristics in the TE10 mode at a port on the waveguide side, S22(dd) shows reflection characteristics in the differential mode at a port on the differential line side, and S21(d) shows conversion amounts from the TE10 mode to the differential mode, respectively.

The dielectric substrate 10 had a relative permittivity of 4.2 and a thickness of 0.36.

In the calculation, a 3D electromagnetic field simulation by a finite element technique was used.

Note that a horizontal axis in FIG. 2 is normalized (standardized) at center frequencies thereof, while a vertical axis in FIG. 2 represents an amplitude indicated in dB.

From FIG. 2, the following are understood: the reflection characteristics at each port are −15 dB or less; a band in which the conversion amount from the waveguide mode to the differential mode is favorable can be secured over a normalized frequency from 0.85 to 1.15, in other words, over a wide band of a specific bandwidth of 30%. It can be confirmed that as compared to 8% in the conventional technique, the bandwidth can be significantly increased with maintaining a layer structure of the substrate.

While there is described the case where the cross section of the waveguide 60 is rectangular in the configuration shown in FIG. 1, it may be any shape excluding a regular polygon and a circle, or it is any shape as long as a long side direction and a short side direction thereof is distinguishable from each other.

In addition, the same applies to the shape of the opening 20; it may be any shape excluding a regular polygon and a circle, or it is any shape as long as a long side direction and a short side direction thereof is distinguishable from each other.

Since one of the end portions in the long side direction of the opening 20 is a short circuit point, a midpoint position in the long side direction of the opening 20 is a position away from the short circuit point, and intense in the electric field. In addition, a direction of the electric field corresponds to the short side direction of the opening 20 in the midpoint position in the long side direction of the opening 20.

In FIG. 1, there is described the example where the short side direction of the opening 20 in the midpoint position in the long side direction of the opening 20, namely the y-axis direction, completely coincides with the short side direction of the waveguide 60; however, it is not necessarily limited to this, and when an angle formed by the two directions is selected to be different from 90 degrees, coupling between the slot mode and the waveguide mode can be not a little obtained.

While in the configuration shown in FIG. 1, there is shown a symmetric structure about a z-x plane, an asymmetric structure thereof may be alternatively used.

Additionally, while the description is given of the structure where the cavity 51 is hollow (as shown, for example, in FIG. 1), part or all of the cavity 51 may be filled with an insulating material 59 having a relative permittivity more than 1 (as shown, for example, in FIG. 8). In this case, reduction in waveguide dimension can be achieved for the same frequency.

While the waveguide 60 is configured with the metal block 50 in FIG. 1, an insulating material whose surface is plated by a conductor may be substituted for the metal block 50.

Additionally, while the description is given of the example where the wall surface parallel to an x-y plane of the waveguide 60 is configured with the ground conductor 12, the corresponding surface may also be configured with the metal block 50.

While in FIG. 1 the description is given of the example where the ground conductor 11 and columnar conductors 41 are disposed, propagation in the differential mode, slot mode, and waveguide mode is possible even without the ground conductor 11 and columnar conductors 41, and thus a structure without the ground conductor 11 and columnar conductors 41 may be employed.

In this case, the slot mode can be coupled to the z-axis negative direction in addition to the positive direction of the z-axis in which the waveguide 60 is located, and thus a structure newly provided with an waveguide in the backside direction (z-axis negative direction) of the dielectric substrate 10 may be employed.

In FIG. 1, a structure of the waveguide 60 that is extended in the x-axis negative direction and then bent to an arbitrary direction in the x-y plane may be employed.

As described above, the planar circuit to waveguide transition according to Embodiment 1 can achieve the traveling wave conversions from the waveguide mode to the slot mode, and from the slot mode to the differential mode without utilizing resonance, which makes it possible to align the dominant direction of the electric field by the three modes, and thus a wider bandwidth can be expected as compared to the conventional technique that utilizes the resonance phenomenon.

Therefore, both of an achievement with a simple layer structure and wide bandwidth characteristics which are the problems in the conventional techniques become possible.

Embodiment 2

Figure 3:
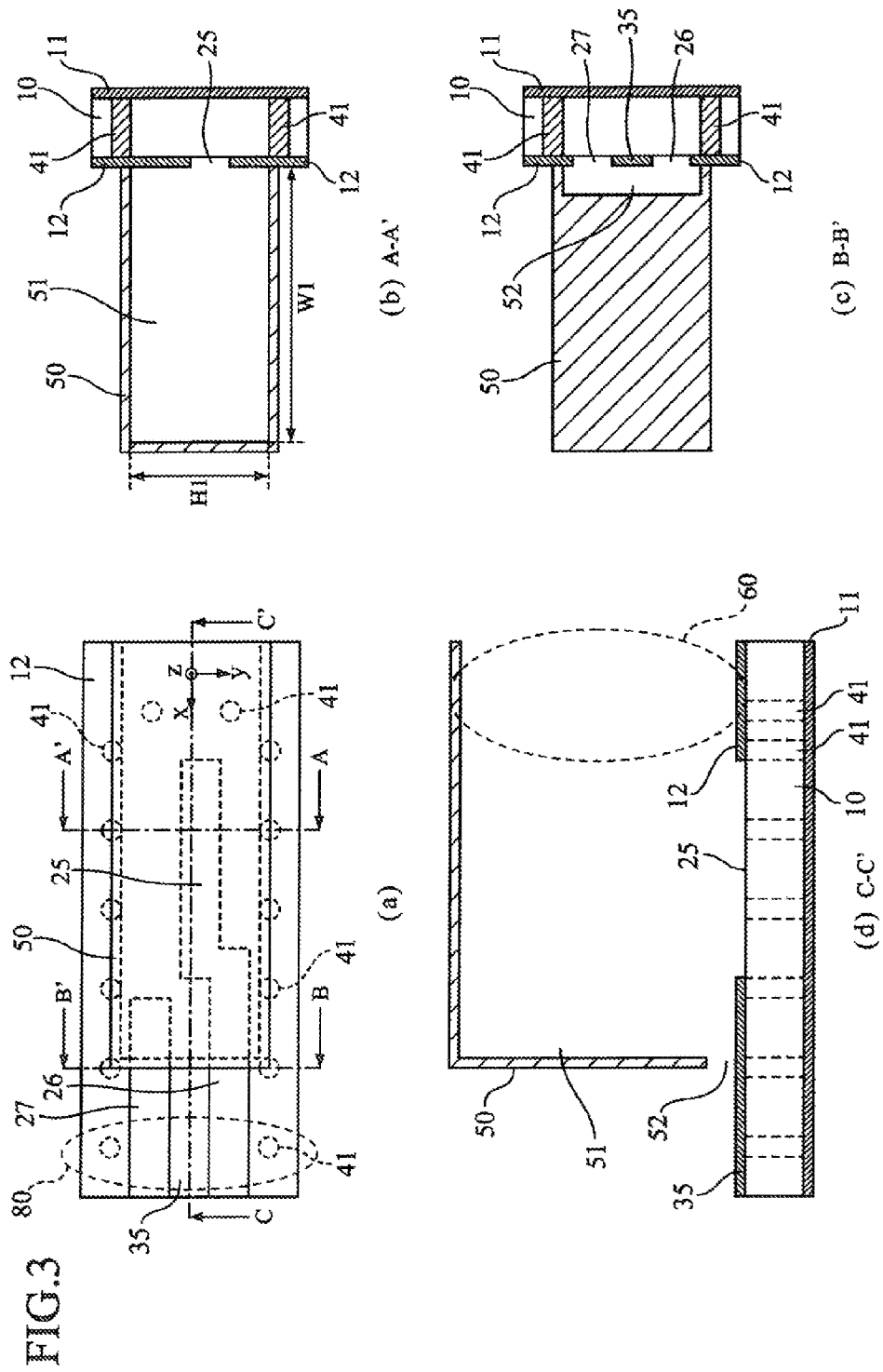
FIGS. 3(*a*), 3(*b*), 3(*c*) and 3(*d*) are configuration diagrams illustrating a structure of a planar circuit to waveguide transition according to Embodiment 2 of the invention.

FIG. 3 is a diagram illustrating a structure of a planar circuit to waveguide transition according to Embodiment 2 of the present invention. FIG. 3(a) is a perspective top plan view, FIG. 3(b) is a cross-sectional view of an A-A' plane in FIG. 3(a), FIG. 3(c) is a cross-sectional view of a B-B' plane in FIG. 3(a), and FIG. 3(d) is a cross-sectional view of a C-C' plane in FIG. 3(a).

As shown in FIG. 3, a ground conductor 12 has an opening 25 in which part of the conductor is removed to form a rectangular shape, and one corner of the opening 25 is connected to an opening 26 formed by removing the conductor to extend in one direction of FIG. 3(a).

An opening 27 formed by removing the conductor to extend to substantially the same direction as the extending direction of the opening 26 is provided on one side of the opening 26.

Both of the openings 26 and 27 are formed in a rectangular shape, and arranged at substantially symmetrical positions about the C-C' plane in FIG. 3(a).

A signal line conductor 35 is formed by these openings 26 and 27 to constitute an unbalanced line 80.

In FIG. 1, there is illustrated the structure where the differential signal line is constituted of the signal line conductors 31 and 32.

In FIG. 3, there is a structure that uses the unbalanced line 80 constituted of only the signal line conductor 35.

As shown in FIG. 3(c), a form of the unbalanced line 80 is a grounded coplanar line in which a ground conductor is constituted of a ground conductor 11, the ground conductor 12 separated from the signal line conductor 35, and columnar conductors 41, and which a signal line conductor is constituted of the signal line conductor 35.

The other structure is the same as that of the aforementioned Embodiment 1, and an explanation thereof will be omitted.

Basic effects by the configuration shown in FIG. 3 are the same as those described in Embodiment 1, and explanations thereof will be omitted.

In the structure shown in FIG. 3, an electric field by the unbalanced line 80 is generated between the signal line conductor 35 and a surrounding ground conductor; an electric field directed in a y-axis direction becomes dominant, similarly to the differential signal line mentioned in Embodiment 1, by making a distance between the signal line conductor 35 and ground conductor 12 closer, that is, reducing dimensions in the y-axis direction of the openings 26 and 27.

For this reason, it becomes possible to align a direction of the electric field in a slot mode of the opening 25 and a direction of the electric field in a TE10 mode of a waveguide 60 in the same direction, which makes it possible to secure wide bandwidth characteristics even in the unbalanced line, as with Embodiment 1.

While the structure of the unbalanced line 80 is symmetrical about a z-x plane in the structure of FIG. 3, it may be a structure having different dimensions in the y-axis direction of the openings 26 and 27, or the center of the signal line conductor 35 may be shifted in the y-axis direction from the z-x plane that is a symmetrical plane of the waveguide 60.

While the opening 25 is structured asymmetrical about the z-x plane in the structure of FIG. 3, a symmetrical structure thereof may also be employed. The opening 25 may have an arbitrary shape as long as the direction of the electric field of the waveguide 60 and the direction of the electric field in the slot mode of the opening 25 can be aligned approximately.

From the above, the planar circuit to waveguide transition according to Embodiment 2 can provide the same effects as those described in Embodiment 1 even in the transition of the unbalanced line and the waveguide.

Embodiment 3

Figure 4:
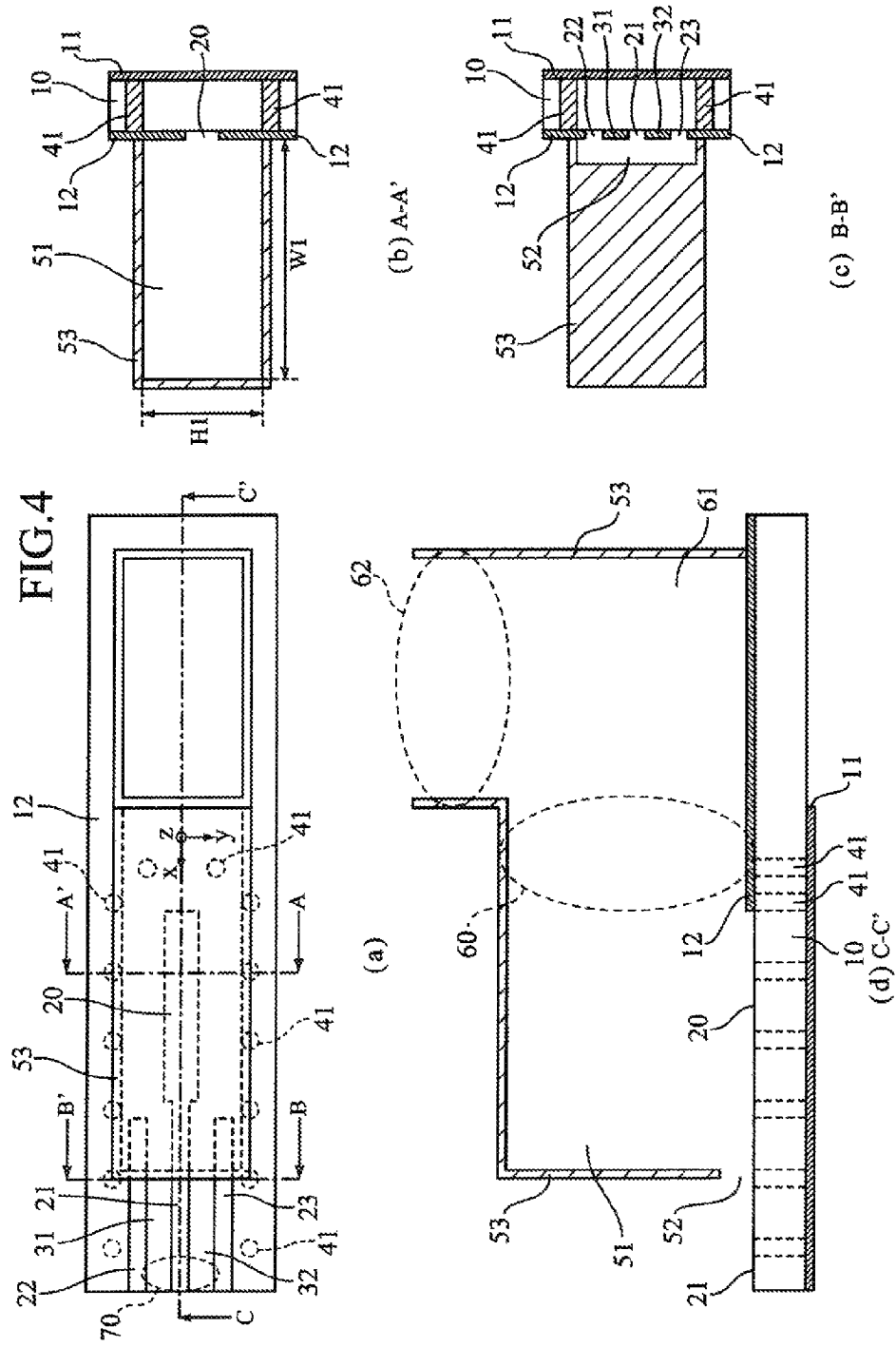
FIGS. 4(*a*), 4(*b*), 4(*c*) and 4(*d*) are configuration diagrams illustrating a structure of a planar circuit to waveguide transition according to Embodiment 3 of the invention.

FIG. 4 is a diagram illustrating a structure of a planar circuit to waveguide transition according to Embodiment 3 of the present invention. FIG. 4(a) is a perspective top plan view, FIG. 4(b) is a cross-sectional view of an A-A' plane in FIG. 4(a), FIG. 4(c) is a cross-sectional view of a B-B' plane in FIG. 4(a), and FIG. 4(d) is a cross-sectional view of a C-C' plane in FIG. 4(a).

As shown in FIG. 4, a metal block 53 is different in shape from the metal block 50 in FIG. 1, and has a structure in which a waveguide 60 provided with a bend 61 turning to a z-axis direction is connected to a waveguide 62 for propagation in the z-axis direction.

The other structure is the same as that of the aforementioned Embodiment 1, and an explanation thereof will be omitted.

Basic effects by a configuration shown in FIG. 4 are the same as those described in Embodiment 1, and explanations thereof will be omitted.

In the structure of FIG. 1, a direction of propagation in the waveguide is limited to a plane direction of a dielectric substrate 10, namely an x-y plane, whereas according to the configuration of FIG. 4, it also becomes possible to propagate signals transited from a planar-circuit to waveguide mode in a thickness direction of the dielectric substrate 10, namely in a z-axis direction. This structure is available by applying the metal block 53 having a modified shape thereto.

While in this example, a waveguide signal extracting direction of the waveguide 62 is described in a direction at 90 degrees (right angles) with the x-y plane, namely in the z-axis direction, the extracting direction is not limited to this, but may be selected arbitrarily; according to the configuration of FIG. 4, it is possible to extract waveguide signals in a direction having an arbitrary angle with the x-y plane.

Figure 5:
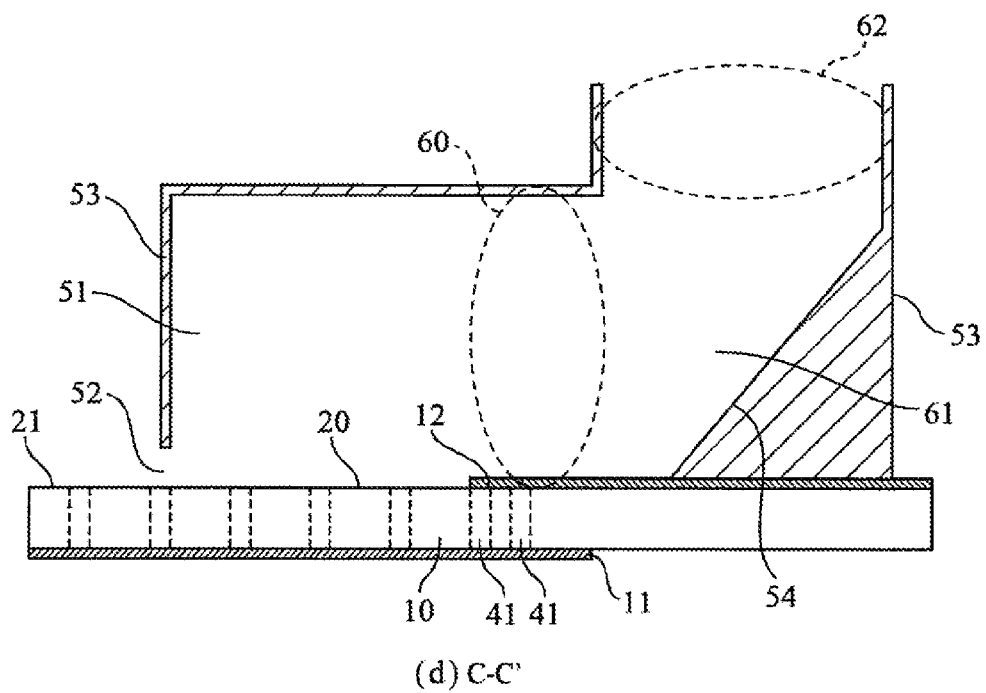
FIG. 5 is a configuration diagram illustrating a structure of another planar circuit to waveguide transition according to Embodiment 3 of the invention.

While in FIG. 4 there is illustrated the example where the bend 61 is provided in a right-angled structure, as shown in FIG. 5, the shape of the metal block 53 such that the corner of the bend 61 is provided in a cut structure may be adopted, and a corner cut portion 54 may be adopted by another structure having an arc-like portion, a stepwise portion, or the like.

From the above, the planar circuit to waveguide transition according to Embodiment 3 makes it possible to select a waveguide extraction opening in an arbitrary direction, in addition to the effects described in Embodiment 1.

Embodiment 4

Figure 6:
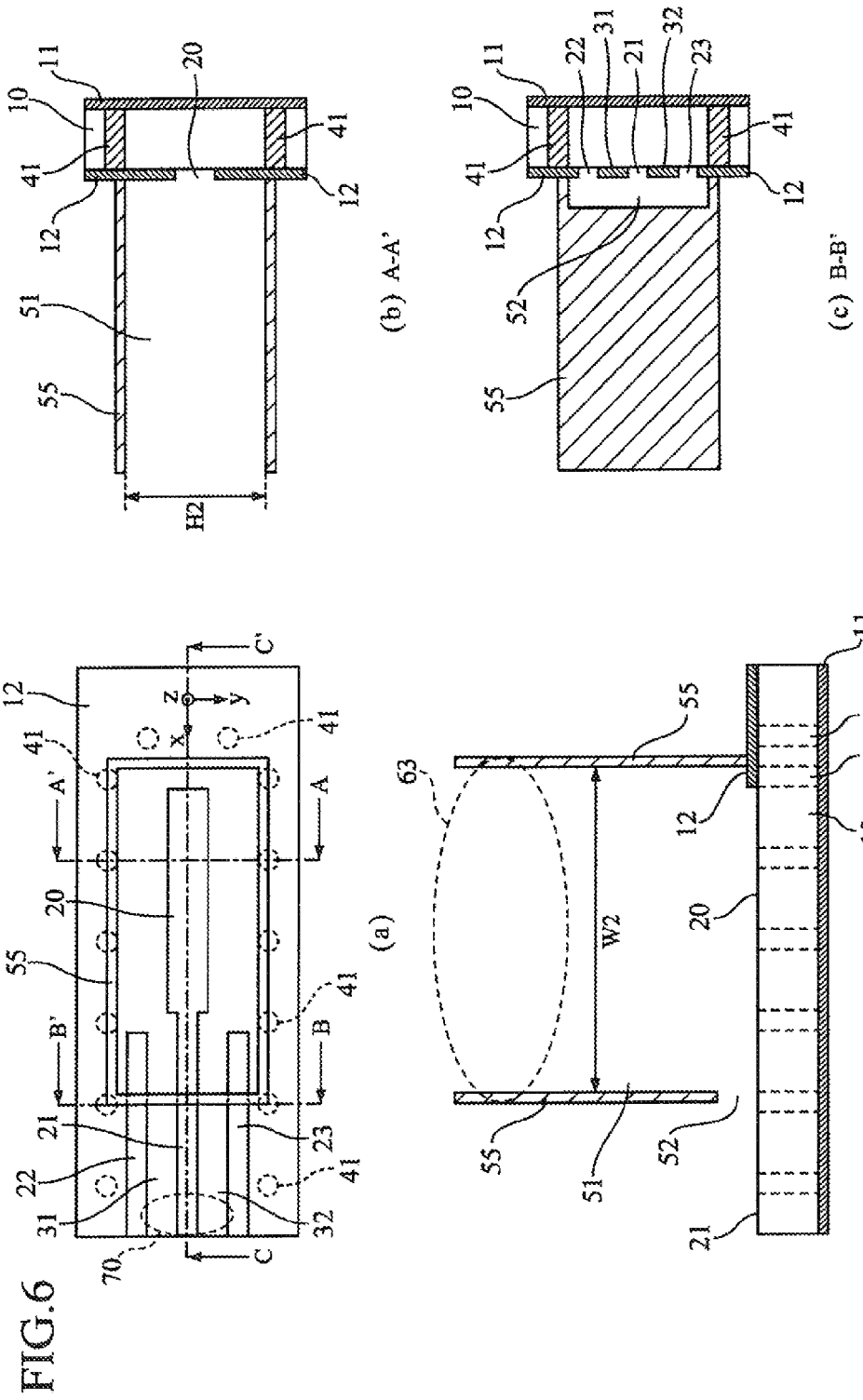
FIGS. 6(*a*), 6(*b*), 6(*c*) and 6(*d*) are configuration diagrams illustrating a structure of a planar circuit to waveguide transition according to Embodiment 4 of the invention.

FIG. 6 is a diagram illustrating a structure of a planar circuit to waveguide transition according to Embodiment 4 of the present invention. FIG. 6(a) is a perspective top plan view, FIG. 6(b) is a cross-sectional view of an A-A' plane in FIG. 6(a), FIG. 6(c) is a cross-sectional view of a B-B' plane in FIG. 6(a), and FIG. 6(d) is a cross-sectional view of a C-C' plane in FIG. 6(a).

As shown in FIG. 6, a metal block 55 is different in shape from the metal block 50 in FIG. 1, and has a structure in which an extending direction of the waveguide 63 shown in FIG. 6(d) is directed to the z-axis direction.

The other structure is the same as that of the aforementioned Embodiment 1, and an explanation thereof will be omitted.

Basic effects by a configuration shown in FIG. 6 are the same as those described in Embodiment 1, and explanations thereof will be omitted.

In the structure shown in FIG. 4, the bend 61 is used in order to set the extracting direction of the waveguide in an arbitrary direction different from the x-y plane.

According to the structure shown in FIG. 6, the bend structure is unnecessary, whereby simplification of the structure can be achieved.

In FIG. 6, an x-y cross-sectional shape of a waveguide 63 has a rectangular shape such that W2>H2, where a dimension in an x-axis direction is W2, and a dimension in a y-axis direction is H2.

Therefore, the lowest-order mode (basic mode) of the waveguide 63 is the TE10 mode such that an electric field is oriented in the y-axis direction, and thus it is possible to maintain the same direction as that of the electric field of the waveguide 60 shown in Embodiment 1.

While in this example, the description is given about the example that an extracting direction of the waveguide 63 is set in the z-axis direction, the extracting direction of the waveguide 63 may be set to a direction having an arbitrary angle with the x-y plane, as with Embodiment 2.

From the above, the planar circuit to waveguide transition according to Embodiment 4 makes it possible to achieve the simplification of the metal block structure, in addition to the effects described in Embodiment 3.

Embodiment 5

Figure 7:
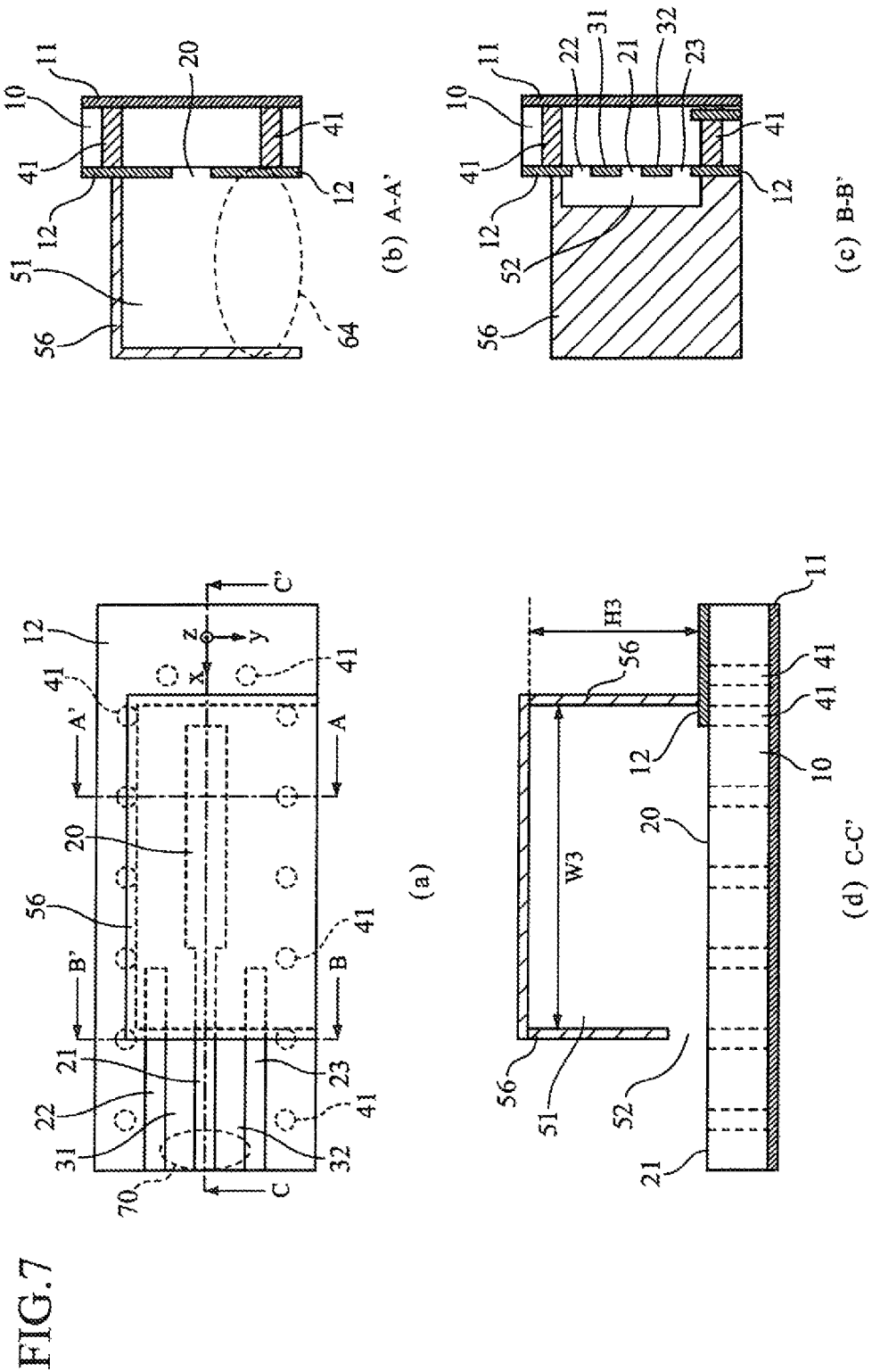
FIGS. 7(*a*), 7(*b*), 7(*c*) and 7(*d*) are configuration diagrams illustrating a structure of a planar circuit to waveguide transition according to Embodiment 5 of the invention.

FIG. 7 is a diagram illustrating a structure of a planar circuit to waveguide transition according to Embodiment 5 of the present invention. FIG. 7(a) is a perspective top plan view, FIG. 7(b) is a cross-sectional view of an A-A' plane in FIG. 7(a), FIG. 7(c) is a cross-sectional view of a B-B' plane in FIG. 7(a), and FIG. 7(d) is a cross-sectional view of a C-C' plane in FIG. 7(a).

As shown in FIG. 7, a metal block 56 is different in shape from the metal block 50 shown in FIG. 1, and has a structure in which an extending direction of a waveguide 64 is a y-axis direction.

The other structure is the same as that of the aforementioned Embodiment 1, and an explanation thereof will be omitted.

Basic effects by a configuration shown in FIG. 7 are the same as those described in Embodiment 1, and explanations thereof will be omitted.

As shown in FIG. 7, a z-x cross-sectional shape of the waveguide 64 shown in FIG. 7(b) is a rectangular shape such that W3>H3, where a dimension in an x-axis direction is W3, and a dimension in a z-axis direction is H3.

Therefore, the lowest-order mode (basic mode) of the waveguide 64 is the TE10 mode such that an electric field is oriented in the z-axis direction, and has an intensity distribution in the x-axis direction.

In the structure shown in FIG. 6, it is possible to set the extracting direction of the waveguide 63 in the z-axis direction, and it becomes possible to change the extracting direction in an arbitrary direction when the bend structure is applied thereto after extraction in the z-axis direction. Thus, a transmission thereof in the y-axis direction is possible.

According to the structure shown in FIG. 7, the bend structure is unnecessary to thereby achieve simplification of the structure, and it can also be directly transited to the TE10 mode such that the electric field is oriented in the z-axis direction.

In other words, a conversion to a waveguide mode in which the direction of the electric field is oriented in a vertical direction of the dielectric substrate 10 becomes possible.

While in this example, the extracting direction of the waveguide 64 is described about the example that is set in the y-axis direction, the extracting direction of the waveguide 64 may be set to a direction having an arbitrary angle with the z-x plane, as with Embodiment 3.

From the above, the planar circuit to waveguide transition according to Embodiment 5 enables a conversion to the waveguide mode in which the direction of the electric field is oriented in the vertical direction of the dielectric substrate 10, in addition to the effects described in Embodiment 1.

It is noted that in the present invention, a free combination in the embodiments, a modification of arbitrary components in the embodiments, or an omission of arbitrary components in the embodiments is possible within a range of the invention.

INDUSTRIAL APPLICABILITY

The planar circuit to waveguide transition according to the present invention includes: the plurality of openings formed by removing part of the conductor pattern on the dielectric substrate; the signal line conductor formed by part of the conductor pattern remaining in the region between the openings; and the metal member disposed so as to cover the openings to constitute the waveguide together with the conductor pattern, whereby both of achievement of the simple layer structure and wide bandwidth characteristics are possible. Thus, it is suitable for use in a planar circuit to waveguide transition coping with a wide bandwidth.

EXPLANATION OF REFERENCE NUMERALS

10: dielectric substrate
11: ground conductor
12: ground conductor (conductor pattern)
20 to 23, 25 to 27: openings
31, 32, 35: signal line conductors
41: columnar conductor (connection conductor)
50, 53, 55, 56: metal blocks (metal members)
51: cavity
52: hole
54: corner cut portion
60, 62 to 64: waveguides
61: bend
70: differential line (balanced line)
80: unbalanced line.

The invention claimed is:

1. A planar circuit to waveguide transition, comprising:
a conductor pattern provided on one side of a dielectric substrate;
a first opening in which a first part of the conductor pattern is removed;
a second opening in which a second part of the conductor pattern is removed such that one end of the first opening is open with respect to one end of the second opening;
a third opening and a fourth opening which are separated from the second opening, and in which the conductor pattern is removed to be parallel to an extending direction of the second opening at opposite positions across the second opening;
a first signal line conductor formed by the conductor pattern remaining in a region between the second opening and the third opening;
a second signal line conductor formed by the conductor pattern remaining in a region between the second opening and the fourth opening to constitute a balanced line together with the first signal line conductor; and
a metal member having a cavity and arranged to cover the first opening to constitute a waveguide together with the conductor pattern,
wherein each of the first, third and fourth openings is closed on three sides by the conductor pattern.

2. The planar circuit to waveguide transition according to claim 1, wherein a material having a relative permittivity of more than 1 is arranged in the cavity of the metal member.

3. The planar circuit to waveguide transition according to claim 1, wherein the metal member is arranged to cover the first opening from at least one side in a normal direction of the open end of the first opening.

4. The planar circuit to waveguide transition according to claim 1, further comprising:
a ground conductor provided on the other side of the dielectric substrate; and
a connection conductor that connects the conductor pattern with the ground conductor to penetrate the dielectric substrate.

5. The planar circuit to waveguide transition according to claim 1, wherein the metal member is configured such that the waveguide is extended in a parallel direction to a planar direction of the conductor pattern.

6. The planar circuit to waveguide transition according to claim 1, wherein the metal member is configured such that the waveguide is extended in a different direction from a direction parallel to a planar direction of the conductor pattern in the first opening.

7. The planar circuit to waveguide transition according to claim 1, wherein the metal member is configured such that the waveguide is first extended in a parallel direction to a planar direction of the conductor pattern and that then the extending direction thereof is changed to a direction that is not parallel with the parallel direction.

8. A planar circuit to waveguide transition, comprising:
a conductor pattern provided on one side of a dielectric substrate;
a first opening in which a first part of the conductor pattern is removed;
a second opening in which a second part of the conductor pattern is removed such that one end of the first opening is open with respect to one end of the second opening;
a third opening which is separated from the second opening, and in which the conductor pattern is removed to be parallel to an extending direction of the second opening;
a signal line conductor formed by the conductor pattern remaining in a region between the second opening and the third opening to constitute an unbalanced line; and
a metal member having a cavity and arranged to cover the first opening to constitute a waveguide together with the conductor pattern,
wherein each of the first and third openings is closed on three sides by the conductor pattern.

9. The planar circuit to waveguide transition according to claim 8, wherein the metal member is configured such that the waveguide is first extended in a parallel direction to a planar direction of the conductor pattern and that then the extending direction thereof is changed to a direction that is not parallel with the parallel direction.

10. The planar circuit to waveguide transition according to claim 8, wherein the metal member is configured such that the waveguide is extended in a different direction from a direction parallel to a planar direction of the conductor pattern in the first opening.

11. The planar circuit to waveguide transition according to claim 8, wherein the metal member is configured such that the waveguide is extended in a parallel direction to a planar direction of the conductor pattern.

12. The planar circuit to waveguide transition according to claim 8, further comprising:
   a ground conductor provided on the other side of the dielectric substrate; and
   a connection conductor that connects the conductor pattern with the ground conductor to penetrate the dielectric substrate.

13. The planar circuit to waveguide transition according to claim 8, wherein the metal member is arranged to cover the first opening from at least one side in a normal direction of the open end of the first opening.

14. The planar circuit to waveguide transition according to claim 8, wherein a material having a relative permittivity of more than 1 is arranged in the cavity of the metal member.

* * * * *